United States Patent
Srinivasan

(10) Patent No.: US 9,335,375 B2
(45) Date of Patent: May 10, 2016

(54) INTEGRATED DEVICE TEST CIRCUITS AND METHODS

(75) Inventor: Venkata Narayanan Srinivasan, Greater Noida (IN)

(73) Assignee: STMICROELECTRONICS INTERNATIONAL N.V., Schiphol (NL)

( * ) Notice: Subject to any disclaimer, the term of this patent is extended or adjusted under 35 U.S.C. 154(b) by 597 days.

(21) Appl. No.: 13/172,606

(22) Filed: Jun. 29, 2011

(65) Prior Publication Data

US 2012/0166131 A1 Jun. 28, 2012

(30) Foreign Application Priority Data

Dec. 28, 2010 (IN) ............................ 3123/DEL/2010

(51) Int. Cl.
| | |
|---|---|
| G01R 31/00 | (2006.01) |
| G01R 31/3185 | (2006.01) |
| G01R 31/28 | (2006.01) |
| G01R 31/317 | (2006.01) |
| H04L 12/26 | (2006.01) |

(52) U.S. Cl.
CPC ........ *G01R 31/318541* (2013.01); *G01R 31/00* (2013.01); *G01R 31/281* (2013.01); *G01R 31/31701* (2013.01); *H04L 12/2697* (2013.01)

(58) Field of Classification Search
CPC ................. G01R 31/00; G01R 31/281; G01R 31/31701; H04L 12/2697
USPC ............................................. 702/120, 58, 64
See application file for complete search history.

(56) References Cited

U.S. PATENT DOCUMENTS

| | | | | |
|---|---|---|---|---|
| 5,377,197 | A * | 12/1994 | Patel et al. ..................... | 714/724 |
| 7,367,007 | B1 * | 4/2008 | Sundararajan et al. ........ | 716/128 |
| 2002/0010560 | A1 * | 1/2002 | Balachandran ............... | 702/118 |
| 2004/0111658 | A1 * | 6/2004 | Natsume ....................... | 714/752 |
| 2006/0164136 | A1 * | 7/2006 | Shin .............................. | 327/143 |
| 2008/0091992 | A1 * | 4/2008 | Juhn et al. ..................... | 714/724 |
| 2009/0132879 | A1 * | 5/2009 | Gangappa ..................... | 714/729 |
| 2009/0273383 | A1 * | 11/2009 | Takatori et al. ............... | 327/218 |
| 2012/0092046 | A1 * | 4/2012 | Li et al. ......................... | 327/143 |
| 2012/0166899 | A1 * | 6/2012 | Gillespie et al. ............. | 714/726 |

* cited by examiner

*Primary Examiner* — Paul D Lee
(74) *Attorney, Agent, or Firm* — Seed Intellectual Property Law Group PLLC

(57) ABSTRACT

Test circuits and methods for detecting faults in integrated devices are disclosed. In an embodiment, a circuit may include an input node configured to receive a test signal, and a transition circuit configured to generate a transit on at least one voltage level indicator pin dependent on the test signal. The circuit may also include a data capture circuit configured to capture the output of the at least one voltage level indicator pin to test for stuck-at faults. In another embodiment, a method may include receiving a test signal, generating a transit on at least one voltage level indicator pin dependent on the test signal, and capturing the output of the at least one voltage level indicator pin to test for stuck-at faults.

26 Claims, 2 Drawing Sheets

INTEGRATED DEVICE TEST CIRCUITS AND METHODS

PRIORITY CLAIM

The instant application claims priority to Indian Patent Application No. 3123/DEL/2010, filed Dec. 28, 2010, which application is incorporated herein by reference in its entirety.

TECHNICAL FIELD

Test circuits and methods for detecting faults in integrated devices are disclosed.

BACKGROUND

Despite advances in semiconductor processing technology, integrated circuits can be manufactured with errors. For example, just a single bit error can render a circuit unusable. Accordingly, manufacturers have implemented various techniques to identify various circuit faults.

SUMMARY

According to an aspect, a test circuit may include an input node configured to receive a test signal, a transition circuit configured to generate a transit on at least one voltage level indicator pin dependent on the test signal, and a data capture circuit configured to capture the output of the at least one voltage level indicator pin to test for stuck-at faults.

In another aspect, the at least one voltage level indicator pin may include at least one of a voltage level indicator pin at a pad, and a voltage level indicator pin at an analogue block.

In still another aspect, the data capture circuit may be configured to test for a stuck-at 1 (SA1) fault.

In still yet another aspect, the test signal may comprise a 'OR' combination of a first power-on reset signal and a second power-on reset signal. The first power-on reset signal may be a scan reset signal.

In other aspects, the circuit may comprise a reset circuit configured to receive the first power-on reset signal and a reset gating signal, wherein the reset circuit may be configured to reset all scan flops in the device excluding the data capture circuit flops (which may not include a reset) when both first power-on reset signal and a reset gating signal are forced to '0'.

The circuit may comprise reset gating circuit configured to enable the reset gating signal dependent on a reset gating 'AND' gate output.

The reset gating may comprise: the reset gating 'AND' gate configured to generate the reset gating signal by AND combining a test enable signal and a gating bit signal; a flip-flop configured to output the gating bit signal dependent on a clocked input of test clock signal and a test gated reset input; where an 'OR' gate configured to OR combine the data signal and the test enable signal to generate the test gated reset signal.

The circuit may be further configured to be an integrated circuit.

A test arrangement may comprise: the circuit as described herein; and a test controller configured to be coupled to the circuit configured to receive the data capture circuit output.

According to another aspect, a method of testing a circuit may include receiving a test signal; generating a transit on at least one voltage level indicator pin dependent on the test signal; and capturing the output of the at least one voltage level indicator pin to test for stuck-at faults.

The at least one voltage level indicator pin may comprise at least one of: a voltage level indicator pin at a pad; and a voltage level indicator pin at an analogue block.

The method may further comprise testing for a stuck-at 1 (SA1) fault.

The method may further comprise performing 'OR' logic combination on a first power-on reset signal and a second power-on reset signal to generate the test signal.

The first power-on reset signal may be a scan reset signal.

The method may further comprise resetting the scan flops of the device excluding the data capture circuit flops, when both the first power-on reset signal and a reset gating signal are forced to '0'.

The method may further comprise enabling the reset gating signal dependent on a reset gating AND gate output.

Enabling the reset gating signal may comprise: AND logic combining, at a reset gating AND gate, a test enable signal and a gating bit signal to generate the reset gating signal; latching the gating bit signal dependent on a clocked input of test clock signal and a test gated reset signal, which may be generated by OR logic combining the data signal and the test enable signal to generate the test gated reset signal.

According to still another aspect, there is provided a computer-readable medium encoded with instructions that, when executed by a computer, perform: receiving a test signal; generating a transit on at least one voltage level indicator pin dependent on the test signal; and capturing the output of the at least one voltage level indicator pin to test for stuck-at faults.

The at least one voltage level indicator pin may comprise at least one of: a voltage level indicator pin at a pad; and a voltage level indicator pin at an analogue block.

The computer-readable medium may be encoded with instructions that, when executed by a computer, may further perform testing for a stuck-at 1 (SA1) fault.

A method may further comprise performing 'OR' logic combination on a first power-on reset signal and a second power-on reset signal to generate the test signal.

The first power-on reset signal may be a scan reset signal.

The computer-readable medium encoded with instructions that, when executed by a computer, may further perform resetting the scan flops of the device excluding the data capture circuit flops when both the first power-on reset signal and a reset gating signal are forced to '0'.

The computer-readable medium encoded with instructions that, when executed by a computer, may further perform enabling the reset gating signal dependent on a reset gating AND gate output.

Enabling the reset gating signal may cause the computer to further perform: AND logic combining, at a reset gating AND gate, a test enable signal and a gating bit signal to generate the reset gating signal; latching the gating bit signal dependent on a clocked input of test clock signal and a test gated reset signal, which may be generated by OR logic combining the data signal and the test enable signal to generate the test gated reset signal.

According to a fourth aspect there is provided an apparatus comprising at least one processor and at least one memory including computer program code the at least one memory and the computer program code configured to, with the at least one processor, cause the apparatus at least to perform: receiving a test signal; generating a transit on at least one voltage level indicator pin dependent on the test signal; and capturing the output of the at least one voltage level indicator pin to test for stuck-at faults.

The at least one voltage level indicator pin may comprise at least one of: a voltage level indicator pin at a pad; and a voltage level indicator pin at an analogue block.

The apparatus may further perform testing for a stuck-at 1 (SA1) fault.

The apparatus may further perform performing 'OR' logic combination on a first power-on reset signal and a second power-on reset signal to generate the test signal.

The first power-on reset signal may be a scan reset signal.

The apparatus may further perform resetting the scan flops of the device excluding the data capture circuit flops when both the first power-on reset signal and a reset gating signal are forced to '0'.

The apparatus may further perform enabling the reset gating signal dependent on a reset gating AND gate output.

Enabling the reset gating signal may cause the apparatus to further perform: AND logic combining, at a reset gating AND gate, a test enable signal and a gating bit signal to generate the reset gating signal; latching the gating bit signal dependent on a clocked input of test clock signal and a test gated reset signal, which may be generated by OR logic combining the data signal and the test enable signal to generate the test gated reset signal.

According to a fifth aspect there is provided apparatus comprising: means for receiving a test signal; means for generating a transit on at least one voltage level indicator pin dependent on the test signal; and means for capturing the output of the at least one voltage level indicator pin to test for stuck-at faults.

The at least one voltage level indicator pin may comprise at least one of: a voltage level indicator pin at a pad; and a voltage level indicator pin at an analogue block.

The apparatus may further comprise means for testing for a stuck-at 1 (SA1) fault.

The apparatus may further comprise means for performing 'OR' logic combination on a first power-on reset signal and a second power-on reset signal to generate the test signal.

The first power-on reset signal may be a scan reset signal.

The apparatus may further comprise means for resetting the scan flops of the device excluding the data capture circuit flops when both the first power-on reset signal and a reset gating signal are forced to '0'.

The apparatus may further comprise means for enabling the reset gating signal dependent on a reset gating AND gate output.

The apparatus may further comprise means for enabling the reset gating signal may comprise: AND logic combining, at a reset gating AND gate, a test enable signal and a gating bit signal to generate the reset gating signal; latching the gating bit signal dependent on a clocked input of test clock signal and a test gated reset signal, which may be generated by OR logic combining the data signal and the test enable signal to generate the test gated reset signal.

BRIEF DESCRIPTION OF THE DRAWINGS

Various embodiments are described in detail in the discussion below and with reference to the following drawings.

DETAILED DESCRIPTION

In order to speed up the diagnosis of errors in integrated circuits, a built-in self-testing (BIST) circuit may be provided. Briefly, and in general terms, the BIST circuit may be used to test parts of the circuit during manufacture. For example, an integrated circuit which has a BIST circuit may be subjected to a test regimen by automated test equipment (ATE).

The automated test equipment (ATE) typically works in response to a test sequence or input that may be provided by an automatic test pattern generator (ATPG), which when applied to the circuit under test, allows a distinction to be made between proper circuit behavior and a faulty circuit behavior. For example, ATPG patterns may be used to detect faults such as "stuck-at fault" where a signal line in the circuit retains a fixed logic value regardless of inputs applied to the circuit. Stuck-at fault errors may typically be stuck-at 1 (SA1) (e.g., exhibiting a high logic level) and stuck-at 0 (SA0) (e.g., exhibiting a low logic level) fault errors. These faults may be present in many different portions of the circuit.

In certain instances, stuck-at fault detection for voltage level indicator pins may not be fully tested. The stuck-at 0 fault may be tested implicitly during a device start up once both the high voltage HV (3.3 or 5 volt) and low voltage LV (1.2 volt) voltage rails are stable. Once stable, the voltage level indicators at pads and analog blocks effectively indicate a '1' level providing there is no stuck-at 0 fault. There is no explicit stuck-at 0 test pattern used and furthermore no implicit or explicit stuck-at 1 fault test.

Figure 1:
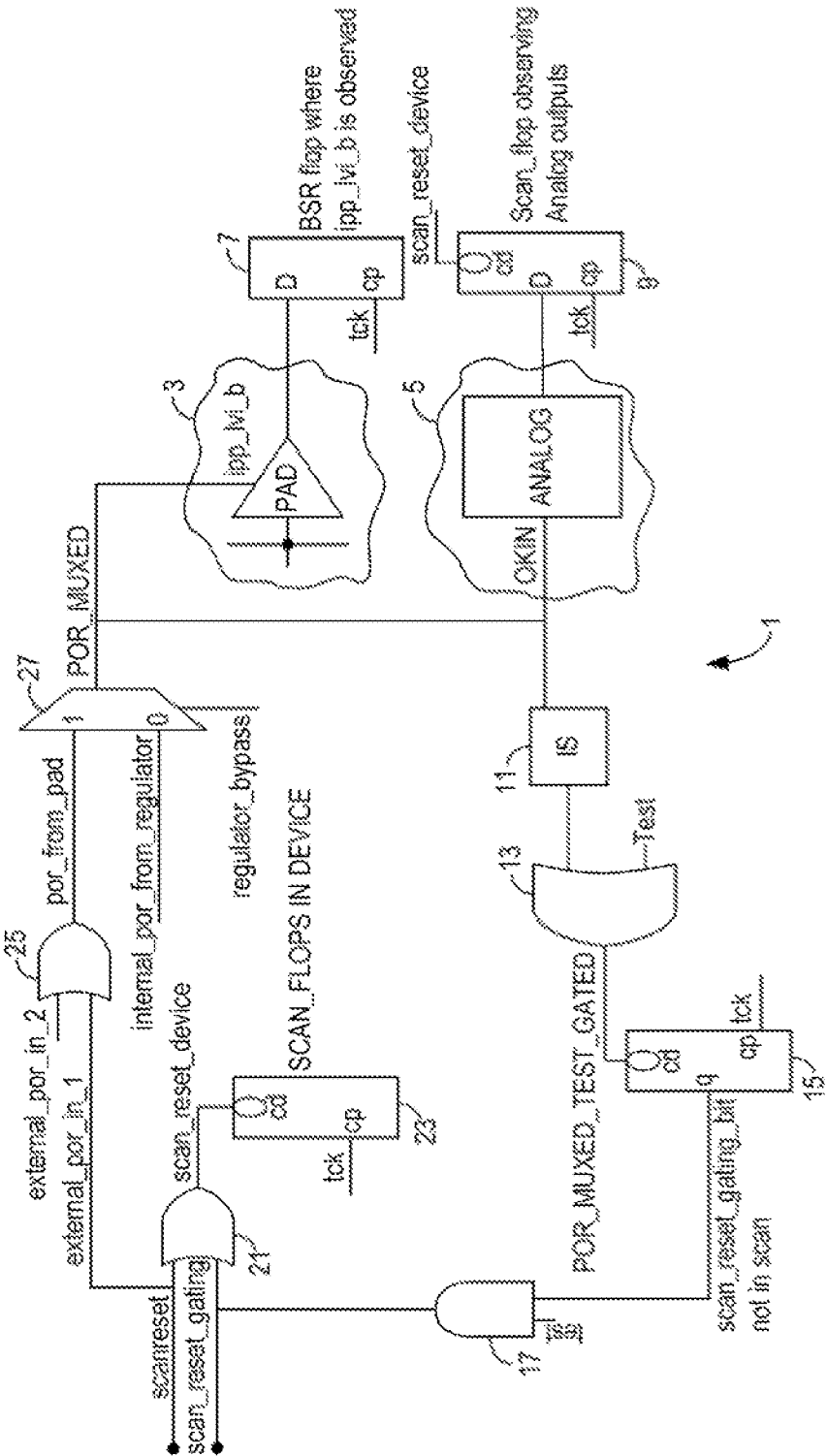
FIG. 1 is a schematic view of a test device according to the various embodiments.

FIG. 1 is a schematic view of a test circuit 1 in accordance with the various embodiments. The test circuit 1 may be used, for example, to test for stuck-at faults in voltage level indicator pins at pads and analogue voltage indicator pins. The test circuit 1 in accordance with the various embodiments may be configured to be coupled to at least one voltage level indicator pin at the pad (ipp_Ivi_b) 3 configured to output the voltage level status to a boundary scan register flop (BSR Flop) 7.

The test circuit 1 in accordance with the various embodiments may include a boundary scan register flop (BSR Flop) 7 configured to be coupled to the voltage level indicator pin at the pad (ipp_Ivi_b) 3, the boundary scan register flop 7 being operable to capture the value of the pad 3.

The test circuit 1 may be coupled to an analog voltage level indicator pin (OKIN) of an analog block 5 which outputs a value to a scan flop (SCAN_FLOP) 9. The test circuit 1, in some embodiments, may couple the scan flop (SCAN_FLOP) 9 to the analog voltage level indicator pin (OKIN), where the scan flop (SCAN_FLOP) 9 is operable to capture the analog output.

Both the voltage level indicator pin at the pad 3 and the voltage level indicator pin (OKIN) at the analog blocks may be configured to be operated or determined based on a power-on a reset multiplex signal (POR_MUXED) signal output from a regulator by-pass multiplexer 27, present an HV domain (3.3 or 5 volt).

In accordance with the various embodiments, the test circuit 1 may include a regulator by-pass multiplexer 27 configured to select between an external or internal power-on reset (POR) signal dependent on whether or not a regulator by-pass signal is enabled. Thus the regulator by-pass multiplexer 27 comprises a first signal input which is in the various embodiments, an internal power-on reset from the regulator (internal_por_from_regulator) signal, a second signal input which in the various embodiments may be a power-on reset from the pad (por_from_pad) signal, and a selection input which may be a regulator bypass (regulator_bypass) signal configured to enable the regulator by-pass multiplexer 27 to select one of the inputs to be output as the power-on reset multiplex signal (POR_MUXED).

In accordance with the various embodiments, the test circuit 1 may include an external power-on reset "OR" gate 25, present in the HV domain (3.3 or 5 volt). The external power-on reset "OR" gate 25 may be configured to receive a first external power-on reset input (external_por_in_1) and a second external power-on reset input signal (external_por_in_2) and logically 'or' the input signals to output the por_from_pad signal, and be coupled to the second input of regulator by-pass multiplexer 27. The external power-on reset "OR" gate 25 can thus be configured to determine whether or not there is at least one power-on reset external input enabled.

In the various embodiments, the first external power-on reset input signal can furthermore be received from a Pad which is also used as a scan reset input (scanreset) to the test circuit 1, where the HV (3.3 or 5 volt) path from pad is used as first external power-on reset input signal and the LV (1.2 volt) path from pad is used as scan reset input.

Furthermore in accordance with the various embodiments, the test circuit 1 may include a reset "OR" gate 21. The reset "OR" gate 21 may be configured with a first input coupled to receive the scan reset input (scanreset) and a second input coupled to receive a scan gating input (scan_reset_gating). The output of the reset "OR" gate 21 may be coupled to selected scan flops in the circuit 1 and configured to reset the contents of the scan flops.

For example, an exemplary scan flop in the test circuit 1 may include the scan flop 23. Accordingly, the output of the reset "OR" gate 21 may be coupled to the low enable reset input. It will be appreciated that any or all of the scan flops may be coupled so that the scan flops are reset depending upon the scan gating and scan reset signals both being set low.

In accordance with the various embodiments, the test circuit 1 may include a test enable "AND" gate 17. The test enable "AND" gate 17 may generate a scan reset gating signal dependent on a first input which is a test enable input (TEST) signal and a second input which is a scan-reset-gating-bit not in scan (scan_reset_gating_bit not in scan) signal. In other words, the test enable "AND" gate 17 may be configured to determine when the test circuit is enabled.

In accordance with the various embodiments, the test circuit 1 may further include a power-on reset multiplex test gated flop 15 configured to receive a clocked input of the test clock signal, and a low level reset input which can be the power-on reset test gated (POR_MUXED_TEST_GATED) signal. The power-on reset multiplex test gated flop 15 can generate the scan_reset_gating_bit not in scan signal, and thus have an output coupled to the second input of the test enable "AND" gate 17.

In accordance with the various embodiments, the test circuit 1 may include an HV to LV level shifter (level shifting the 3.3 or 5 volt signal down to 1.2 v) 11 and a power-on reset test determination "OR" gate 13. The level shifter stage 11 may be configured to receive the HV (3.3 or 5 volt) power-on reset multiplex signal (POR_MUXED) signal from the regulator by-pass multiplexer 27 and output an LV (1.2 volt) signal to a first input of the power-on reset test determination "OR" gate 13, where the second input to the power-on reset test determination "OR" gate 13 may include a test enable (Test) signal. The output of the power-on reset test determination "OR" gate 13 is further coupled to the power-on reset multiplex test gated flop 15 as the power-on reset test gated (POR_MUXED_TEST_GATED) signal.

Figure 2:
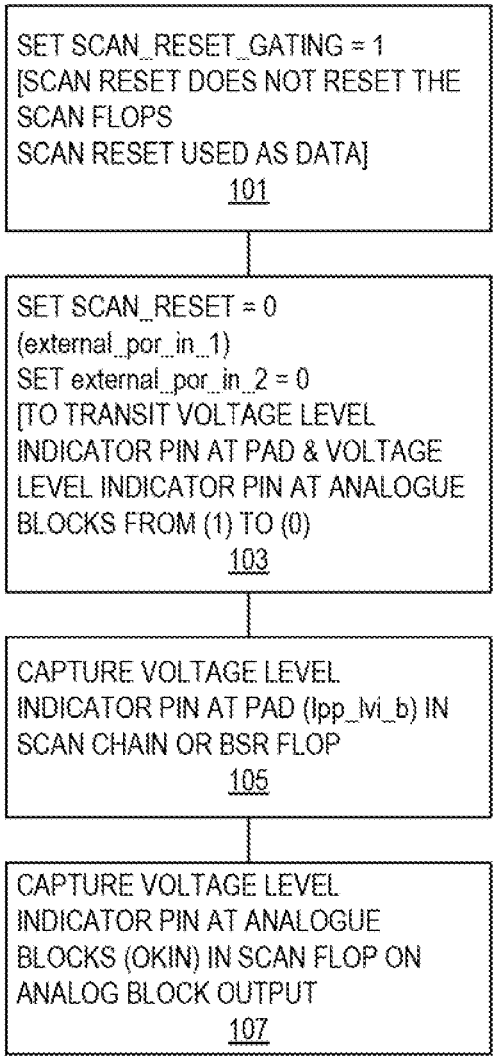
FIG. 2 is a schematic view of a flow diagram of the operation of the test device according to the various embodiments.

Turning now to FIG. 2, the operation of the test circuit 1 shown in FIG. 1 will now be described in further detail. The test circuit 1 may detect the stuck-at fault (SA1) on pads using the test control pads (from where the following signals like Test, external_por_in_1, external_por_in_2 are generated) and test clock pad (tck). This may overcome the problem that if the voltage level indicator pin at all of the test control pads when at a level '0' at same time can in some circumstances reset the device being tested rather than testing for stuck-at 1 problems. Thus, in the embodiments of the application the voltage level indicator pin at test control pads is isolated when detecting stuck-at fault on other pins. In the various embodiments, the voltage level indicator pin on the test clock pad (tck) is isolated to enable the test clock (tck) to capture the voltage status of other pads on boundary scan register flop (BSR Flop) 7 and voltage status of analogue blocks on a scan flop (SCAN_FLOP) 9.

In the various embodiments, the automatic test pattern generator (ATPG) may be configured to be set up in a voltage regulator by-pass mode. Once the voltage regulator by-pass mode is entered the voltage level indicator at the pin at test control pads, test clock pad is set to be high or at a level of "1". Voltage level indicator at the pin of other pads and analog blocks are dependent on the value from external_por_in_1 and external_por_in_2, where external_por_in_1 and external_por_in_2 can be forced to high or level of '1' after a power-up sequence of test device 1.

The scan reset gating bit may be set to a value of 1 as the test signal is enabled and the scan_reset_gating_bit not in scan signal has a value of 1. When the scan reset gating bit is set to a value of 1, the input on the external power-on reset first input (external_por_in_1) or the scan reset signal may not, even when toggled reset the device scan flops during automatic test pattern generation.

In other words, when the scan reset gating bit is set and the test enable signal is also set (such as occurring during an automatic testing sequence), any data will not be cleared even when the power-on reset from the pad signal value is zero. Accordingly, when both the scan reset signal is zero (low) and the external power-on reset second input signal is zero, the power-on reset from pad is also equal to zero. The test enable signal may mask the ability to reset the power-on reset multiplex test gated flop 15, which in turn may mask the ability to scan reset the flops enabling the scan reset input, the external power-on reset first input, to be a data input signal to enable the testing of the pad and analog pins as described herein.

The operation of setting the scan reset gating to a value of one and thus preventing the scan reset from resetting the device scan flops but used as data to find the stuck-at faults (SA1) is shown in 101 of FIG. 2.

Thus in the various embodiments, the automatic test equipment can set the scan reset signal to zero (the external power-on reset first input is set to zero) and furthermore the second external power-on reset input signal is also set to zero generating the external power-on reset "OR" gate 25 a power-on reset from pad signal value of zero. When output by the power-on reset multiplexer 27 this zero value causes a transit of the voltage level indicator pin at the pad and the voltage level indicator pin at the analog block to go from a one to zero.

The generation of the transit event is shown in FIG. 2 at 103.

The transit of the voltage level indicator pin is captured by the boundary scan shift register flop 7 where the value of (ipp_lvi_b) in the scan train is observed.

The operation of capturing the voltage level indicator pin value and testing for a transit can be seen in FIG. 2 at 105.

Furthermore the voltage level indicator pin at the analog blocks (OKIN) may be observed or captured by the scan flop of observing the analog outputs 9.

Capturing the voltage level indicator for the analog block value and testing for a transit can be seen in FIG. 2 at 107.

In the various embodiments, a stuck-at fault 1 (SA1) may be observed at the voltage level indicator pin at the pad 3 (ipp_lvi_b) and/or the analog blocks (OKIN) where a transit is not observed or captured by the automatic test equipment.

In the foregoing description, the various embodiments show examples of logic gates such as AND or OR gates. It should be appreciated that these gates may be replaced by other circuits or other types of logic gates, which may be implemented at least partially in software or firmware.

From the foregoing it will be appreciated that, although various embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A circuit comprising:
    an input node that receives a test signal;
    a multiplexer that receives as input the test signal, an internal power-on reset signal, and a regulator by-pass signal, that selects between the test signal and the internal power-on reset signal based on the regulator by-pass signal, and that outputs one of the test signal and the internal power-on reset signal as a power-on reset multiplex signal;
    a transition circuit that generates a transit on at least one voltage level indicator pin dependent on the power-on reset multiplex signal; and
    a data capture circuit that captures the output of the at least one voltage level indicator pin to determine a stuck-at fault.

2. The circuit as claimed in claim 1, wherein the at least one voltage level indicator pin comprises at least one of:
    a voltage level indicator pin at a pad; and
    a voltage level indicator pin at an analog block.

3. The circuit as claimed in claim 1, wherein the data capture circuit is configured to test for a stuck-at 1 fault.

4. The circuit as claimed in claim 1, wherein the test signal comprises an 'OR' combination of a first power-on-reset signal and a second power-on-reset signal.

5. The circuit as claimed in claim 4, wherein the first power-on-reset signal includes a scan reset signal.

6. The circuit as claimed in claim 4, comprising a reset circuit configured to receive the first power-on-reset signal and a reset gating signal, wherein the reset circuit is configured to reset scan flops when both first power-on-reset signal and a reset gating signal are forced to a selected logic level.

7. The circuit as claimed in claim 6, comprising a reset gating circuit configured to enable the reset gating signal based on a reset gating 'AND' gate output.

8. The circuit as claimed in claim 7, wherein the reset gating circuit comprises:
    a reset gating 'AND' gate configured to generate the reset gating signal by AND combining a test enable signal and a gating bit signal;
    a flip-flop configured to output the gating bit signal dependent on a clocked input of test clock signal and a test gated reset input;
    an 'OR' gate configured to OR combine a data signal and the test enable signal to generate the test gated reset signal.

9. An integrated circuit, comprising:
    an input that receives a test signal;
    a multiplexer that receives as input the test signal, an internal power-on reset signal, and a regulator by-pass signal, that selects between the test signal and the internal power-on reset signal based on the regulator by-pass signal, and that outputs one of the test signal and the internal power-on reset signal as a power-on reset multiplex signal;
    a transition circuit that generates a signal on at least one voltage level indicator pin based upon the power-on reset multiplex signal; and
    a data capture circuit that captures the output of the at least one voltage level indicator pin to indicate a fault error having a selected logic level.

10. The integrated circuit of claim 9, wherein the voltage level indicator pin includes one of a voltage level indicator pin positioned on a pad, and a voltage level indicator pin positioned at an analog block.

11. The integrated circuit of claim 9, wherein the test signal comprises an 'OR' combination of a first power-on-reset signal and a second power-on-reset signal.

12. The integrated circuit of claim 9, comprising a reset circuit configured to receive the first power-on-reset signal and a reset gating signal, wherein the reset circuit is configured to reset scan flops when both first power-on-reset signal and a reset gating signal are latched to a selected logic level.

13. A test apparatus, comprising:
    an input that receives a test signal;
    a multiplexer that receives as input the test signal, an internal power-on reset signal, and a regulator by-pass signal, that selects between the test signal and the internal power-on reset signal based on the regulator by-pass signal, and that outputs one of the test signal and the internal power-on reset signal as a power-on reset multiplex signal;
    a transition circuit that generates a signal on at least one voltage level indicator pin based upon the power-on reset multiplex signal;
    a data capture circuit that captures the output of the at least one voltage level indicator pin to indicate a fault error having a selected logic level; and
    a test controller that receives an output from the data capture circuit.

14. The test apparatus of claim 13, wherein the voltage level indicator pin includes one of a voltage level indicator pin positioned on a pad, and a voltage level indicator pin positioned at an analog block.

15. The test apparatus of claim 13, wherein the test signal comprises an 'OR' combination of a first power-on-reset signal and a second power-on-reset signal.

16. The test apparatus of claim 13, comprising a reset circuit configured to receive the first power-on-reset signal and a reset gating signal, wherein the reset circuit is configured to reset at least one scan flop when both first power-on-reset signal and a reset gating signal are latched to a selected logic level.

17. A method of testing a circuit comprising:
    receiving a test signal;
    receiving an internal power-on reset signal;
    receiving a regulator by-pass signal;
    selecting between the test signal and the internal power-on reset signal based on the regulator by-pass signal;
    outputting one of the test signal and the internal power-on reset signal a power-on reset multiplex signal;
    generating a transit on at least one voltage level indicator pin dependent on the power-on reset multiplex signal;
    capturing the output of the at least one voltage level indicator pin to determine a stuck-at fault; and
    indicating a detected stuck-at fault in automatic test equipment associated with the circuit being tested.

18. The method as claimed in claim 17, wherein capturing the output of the at least one voltage level indicator pin comprises at least one of:
    capturing a voltage level indicator pin at a pad; and
    capturing a voltage level indicator pin at an analog block.

19. The method as claimed in claim 17, further comprising testing for a stuck-at-1 fault.

20. The method as claimed in claim 17, further comprising performing an 'OR' logic combination on a first power-on-reset signal and a second power-on-reset signal to generate the test signal.

21. The method as claimed in claim 20, wherein the first power-on-reset signal is a scan reset signal.

22. The method as claimed in claim 20, further comprising resetting the scan flops when the first power-on reset signal and a reset gating signal are forced to '0'.

23. The method as claimed in claim 22, further comprising enabling the reset gating signal dependent on a reset gating AND gate output.

24. The method as claimed in claim 23, wherein enabling the reset gating signal comprises:
   AND logic combining, at the reset gating AND gate, a test enable signal and a gating bit signal to generate the reset gating signal;
   latching the gating bit signal dependent on a clocked input of test clock signal and test gated reset signal generated by OR logic combining the data signal and the test enable signal to generate the test gated reset signal.

25. An apparatus comprising:
   a processor operably coupled to a memory that is configured to store machine-executable instructions, that when executed by the processor, cause the apparatus to:
   receive a test signal;
   receive an internal power-on reset signal;
   receive a regulator by-pass signal;
   select between the test signal and the internal power-on reset signal based on the regulator by-pass signal;
   output one of the test signal and the internal power-on reset signal as a power-on reset multiplex signal;
   generate a transit on at least one voltage level indicator pin dependent on the power-on reset multiplex signal; and
   capture the output of the at least one voltage level indicator pin to indicate a fault error having a selected logic level.

26. A non-transitory computer-readable medium having instructions for causing a computer to execute a method, comprising:
   receiving a test signal;
   receiving an internal power-on reset signal;
   receiving a regulator by-pass signal;
   selecting between the test signal and an internal power-on reset signal based on a regulator by-pass signal;
   outputting one of the test signal and the internal power-on reset signal as a power-on reset multiplex signal;
   generating a transit on at least one voltage level indicator pin in response to the power-on reset multiplex signal; and
   capturing the output of the at least one voltage level indicator pin to indicate a fault error having a selected logic level.

* * * * *